United States Patent [19]

Morris

[11] Patent Number: 5,577,052
[45] Date of Patent: Nov. 19, 1996

[54] SCAN BASED TESTING FOR ANALOGUE CIRCUITRY

[75] Inventor: John O. Morris, Houston, Tex.

[73] Assignee: Texas Instruments Incorporated, Dallas, Tex.

[21] Appl. No.: 476,834

[22] Filed: Jun. 7, 1995

Related U.S. Application Data

[63] Continuation of Ser. No. 405,740, Mar. 17, 1995, which is a continuation of Ser. No. 961,743, Oct. 16, 1992, abandoned.

[51] Int. Cl.6 ........................................... G06F 15/20
[52] U.S. Cl. .............................. 371/22.5; 371/22.3
[58] Field of Search ................... 371/22.1, 22.3, 371/22.5, 24; 364/579, 580

[56] References Cited

U.S. PATENT DOCUMENTS

| | | | |
|---|---|---|---|
| 4,602,210 | 7/1986 | Fasang et al. | 371/15 |
| 4,907,230 | 3/1990 | Heller et al. | 371/22.1 |
| 4,922,492 | 5/1990 | Fasang et al. | 371/22.1 |
| 5,225,834 | 7/1993 | Imai et al. | 371/22.1 |
| 5,404,358 | 4/1995 | Russell | 371/22.3 |

OTHER PUBLICATIONS

Jon Gabay, How Much Can Design-for-test Reduce the Need for Testing?, Sep. 1, 1990, Computer Design, v29, n17, p. 94(11).

Primary Examiner—Ellis B. Ramirez
Assistant Examiner—Craig Steven Miller
Attorney, Agent, or Firm—Gerald E. Laws; C. Alan McClure; James C. Kesterson

[57] ABSTRACT

An integrated circuit containing analogue operation circuitry having a plurality of nodes for input and output of signals during normal operation, a plurality of scan cells connected to at least said plurality of nodes for containing signals to be utilized in selected tests to be performed on said analogue operation circuitry and responsive to selected output signals is provided. A method for testing a module of analogue circuitry incorporated into an integrated circuit having other circuitry by decoupling a plurality of module signal terminals from respective normal operation connections to a plurality of scan cells, and inputting at least portions of test suites and sensing test result output signals through at least selected ones of said scan cells is provided.

3 Claims, 4 Drawing Sheets

SCAN BASED TESTING FOR ANALOGUE CIRCUITRY

This is a continuation of application Ser. No. 08/405,740, filed Mar. 17, 1995, which was a continuation 1.62 of patent application Ser. No. 07/961,743, filed Oct. 16, 1992, now abandoned.

TECHNICAL FIELD OF THE INVENTION

The present invention relates generally to the testing of large scale integrated circuits, and more particularly to a method and apparatus for testing analogue or mixed signal portions of such integrated circuits.

BACKGROUND OF THE INVENTION

As the technology for manufacturing integrated circuits advances, more and more logic functions may be included in a single integrated circuit device. Modem integrated circuit (IC) devices include over 100,000 transistors on a single semiconductor chip, with these transistors interconnected so as to perform multiple and complex digital functions, such as, for example, those in a general-purpose microprocessor. The manufacture of such circuits incorporating such Very Large Scale Integration (VLSI) requires that the design of the circuit be error free. Further, such digital circuitry is currently being integrated at increasingly higher levels with analogue circuitry resulting in Analogue Very large Scale Integration (AVLSI). The design of these mixed (digital and analogue) circuits again must be error free. In addition, such a circuit requires that no defect be generated during its manufacture, as some manufacturing defects may prevent it from performing all of the functions that it is designed to perform. This requires various types of electrical testing after manufacture.

Development of a test program for an IC and debugging of that program can be very time consuming and costly unless designers consider test issues during the logic design phase. Due to the increased complexity of VLSI and AVLSI chips, it is generally not feasible for test engineering to independently develop and debug test programs. The responsibility now lies with logic and circuit designers to design logic and circuitry such that it is easy to test and requires a reduced set of so-called test "vectors" to thoroughly test the design.

However, as the complexity of the circuit increases, so does the cost and difficulty of verifying and electrically testing each of the devices in the circuit. From an electrical test standpoint, in order to totally verify that each of the transistors in the VLSI circuit properly function, one must theoretically be able to exercise each of the transistors not only individually (in the digital sense, determining that it is neither stuck-open or stuck-closed), but also in conjunction with the other transistors in the circuit in all possible combinations of operations. Analogue circuitry is not susceptible to such testing and instead AC and DC parametric tests are conducted to ensure the analogue devices have been properly fabricated and properly connected. This is normally accomplished by automated testing equipment (ATE) that employs test vectors to perform the desired digital or logic tests. A test vector describes the desired test input (or signals), associated clock pulse (or pulses) and expected test outputs (or signals) for every package pin for a period of time, with the purpose being to "test" a particular cell (or macro). A test vector for analogue circuitry describes the analogue stimuli and analogue outputs. For complex circuitry this may involve a large number of test vectors and accordingly a long test time. Macro and cell are used herein to mean the same thing.

In addition, specific circuit configurations in the VLSI or AVLSI circuit may have some of its devices inaccessible for all but a special combination of signals, thereby hiding a fault or defect unless a very specific pattern of signals is presented. However, the cost of performing such testing on 100% of the manufactured circuits is staggering, considering the high cost of the test equipment required to exercise each circuit in conjunction with the long time required to present each possible combination to each device. This has in the past forced integrated circuit manufacturers to test less than all of the active devices in a chip, with the attendant quality levels of the product being less than optimal. Thus, one of the major problems in integrated circuit design is the ability to adequately test the final IC design and this problem increases with increasing complexity of the integrated circuit.

The key concepts in so-called design for test (DFT) are controllability and observability. Controllability means the ability in a digital sense to set and reset every node, or in an analogue sense to apply an analogue stimulus to every node of the circuit, while observability means the ability to observe either directly or indirectly the state or value of any node in the circuit. The purpose of the various DFT techniques is to increase the ability to control and observe internal nodes from external inputs/outputs. DFT techniques may be employed for logic verification and AC/DC parametric tests.

Designing testability into any circuit will affect the circuitry to some degree. Additional logic will probably have to be added. This additional logic will increase the amount of silicon required to implement the design. The savings from enhanced testability do not usually show up until the development time and testing costs of the circuit and its end system are analyzed.

Circuit designers have used stuck-fault modeling techniques in improving the efficiency of the testing of such digital VLSI circuits. Digital stuck-fault modeling is directed not to stuck-open or stuck-closed defects in individual transistors, but to the effect of such defective transistors (and defective interconnections) resulting in stuck-high and stuck-low outputs of the logic circuit. Minimum patterns of test vectors are then derived for the exercising of the logic circuit, such test patterns being inputs to the circuit designed to cause stuck-high and stuck-low outputs if defects are present. Such techniques have been successful in improving the digital test efficiency of VLSI circuits.

In conjunction with the digital stuck-fault modeling and associated pattern generation, cooperative circuitry may be included in the VLSI circuit specifically directed to improving its testability. One configuration of this cooperative circuitry is a scan path in the logic circuit. The scan path consists of a series of synchronously clocked master/slave latches (or registers), each of which is connected to a particular node in the logic circuit. These latches can be loaded with a serial data stream ("scan in") and can present their contents to the nodes in the logic circuit, presetting the logic circuit nodes to a predetermined state. The logic circuit then can be exercised in normal fashion, with the result of the operation at each of the nodes (having a scan latch) stored in its respective latch. By serially unloading the contents of the latches ("scan out"), the result of the particular test operation at the associated nodes is read out and may be analyzed for improper node operation. Repetition of this operation with a number of different data patterns effectively tests all necessary combinations of the logic circuit, but with a reduced test time and cost compared to separately testing each active component or cell and all their possible interactions. Techniques for scanning such data are discussed by E. J. McCluskey in "A Survey of Design for Testability Scan Techniques", VLSI Design (Vol. 5, No. 12, pp. 38–61, December 1984).

Also as this technology is advancing, users of integrated circuits are desiring specially designed and constructed integrated circuits, for performing functions specific for the user's application. Such integrated circuits have been called Application Specific Integrated Circuits (ASICs). For an ASIC device to be cost-competitive with general purpose microcomputers which may have a special function implemented in programmable software, and to be cost-competitive with a board design made up of smaller scale integrated circuits, the design time of the ASIC circuit must be short and the ASIC circuit must be manufacturable and testable at low cost. Currently, some ASIC devices are being designed to include both digital and analogue circuitry. Accordingly, it is useful for such circuits to be modular in design, with each of the modules performing a certain function, so that a new circuit may be constructed by combining previously-designed circuit modules. Such an approach can also be used for non-ASIC microcomputers and microprocessors. Regardless of the end product, the use of a modular approach allows the designer to use logic which has previously been verified, and already been proven as manufacturable. However, if logic modules which utilize a particular scan path in their original placement in an integrated circuit are placed into a new circuit application, new test patterns will generally be required for the new device, thereby lengthening the design/manufacture cycle time.

As described in U.S. Pat. No. 4,860,290 filed Jun. 2, 1987 and assigned to Texas Instruments Incorporated, a modular approach to utilizing scan paths and other testability circuits has been used and provides thorough coverage of all possible digital faults in an efficient manner. Reduced test time and cost are thus achieved by such modularity.

Recently, MegaModules™ have been used in the design of application-specific integrated circuits (ASICs). (Mega-Module is a trademark of Texas Instruments Incorporated.) Each of these MegaModules™, which for example may be SRAMs, FIFOs, register files, RAMS, ROMS, universal asynchronous receiver-transmitters (UARTs), programmable logic arrays or other logic circuits, are usually defined as integrated circuit modules of at least 500 gates in complexity and are a complex ASIC macro function. These MegaModules™ may be predesigned and stored in an ASIC design library. MegaModules™ can then be used by the designer in the design of an ASIC by placing the design of such an existing MegaModule™ within a certain area on the desired IC chip.

Conventionally, such MegaModules™ may be available as standard catalog devices, but usually are designed without testability. An ASIC, employing MegaModules™ requires that a custom test program be developed for that particular chip. Because a custom testing program has to be devised for each ASIC, the cost of each test program is essentially duplicated. Thus, there is still a need for generic test programs for modular circuits.

Most of the foregoing prior art test schemes are directed at testing logic functions and do not explicitly have the capability to test analogue or mixed analogue and digital circuits. Much like digital circuits, imbedded mixed signal circuits are often difficult to control or observe during test and characterization. It is also difficult to write generic/reusable test programs for mixed signal circuits. Prior test methods for mixed signal circuits have employed additional pins, modified bond out schemes, and unbonded pads to gain access to and control of analogue modules. Thus, there is still a need for an easy and simple way to test mixed signal circuits.

These and other disadvantages of the prior art are overcome by the present invention, however, and improved methods and apparatus for chip-level testing of analogue or mixed analogue and digital circuitry, as well as system-level testing, are provided.

SUMMARY OF THE INVENTION

In a preferred embodiment, method and circuitry are provided that are capable of controlling analogue, or mixed analogue and digital, circuitry for scan in testability schemes presently employed to test an ASIC, or any other type of IC. The methods and circuitry of the present invention place serial digital scan paths, and other circuitry responsive to scan cells (in such paths) and/or appropriate test signals, within the mixed signal or digital circuits and at their input/output interfaces to other mixed signal or digital circuits, so that they may be controlled and observed using standard scan test methodologies. That is, the present invention provides method and apparatus for employing conventional scan in testability schemes to test an analogue circuit or a mixed analogue and digital circuit. Other similar test schemes may be modified in accordance with the teachings of the present invention. Once a test suite of signals to test a circuit is generated for a particular analogue circuit, that same test suite may be employed for that circuit, generally wherever and however that circuit is employed.

The methods and circuits of the present invention may be employed for production tests, as well as initial characterization and debugging, both before and after packaging. By employing a scan based methodology, tests for analogue (or mixed signal) circuits may be "canned" for later reuse, even when the analogue portion of the circuitry is embedded within different chips that employ differing control/observability interfaces; that is, "modular" analogue tests may be written for reusable analogue circuit modules.

It is an object of the present invention to provide a simple method for testing analogue circuits.

It is also an object of the present invention to provide analogue circuits that are easy to test.

It is another object of the present invention to provide scan test schemes for analogue or mixed analogue and digital circuits.

It is yet another object of the present invention to provide method and apparatus for developing scan test suites for analogue circuits.

These and other objects and advantages of the present invention will become apparent from the following detailed description wherein reference is made to the Figures in the accompanying drawings.

BRIEF DESCRIPTION OF THE DRAWINGS

A more complete understanding of the present invention may be derived by referring to the detailed description and claims when considered in conjunction with the accompanying drawings in which like reference numbers indicate like features throughout the drawings, and wherein:

DETAILED DESCRIPTION

Figure 1:
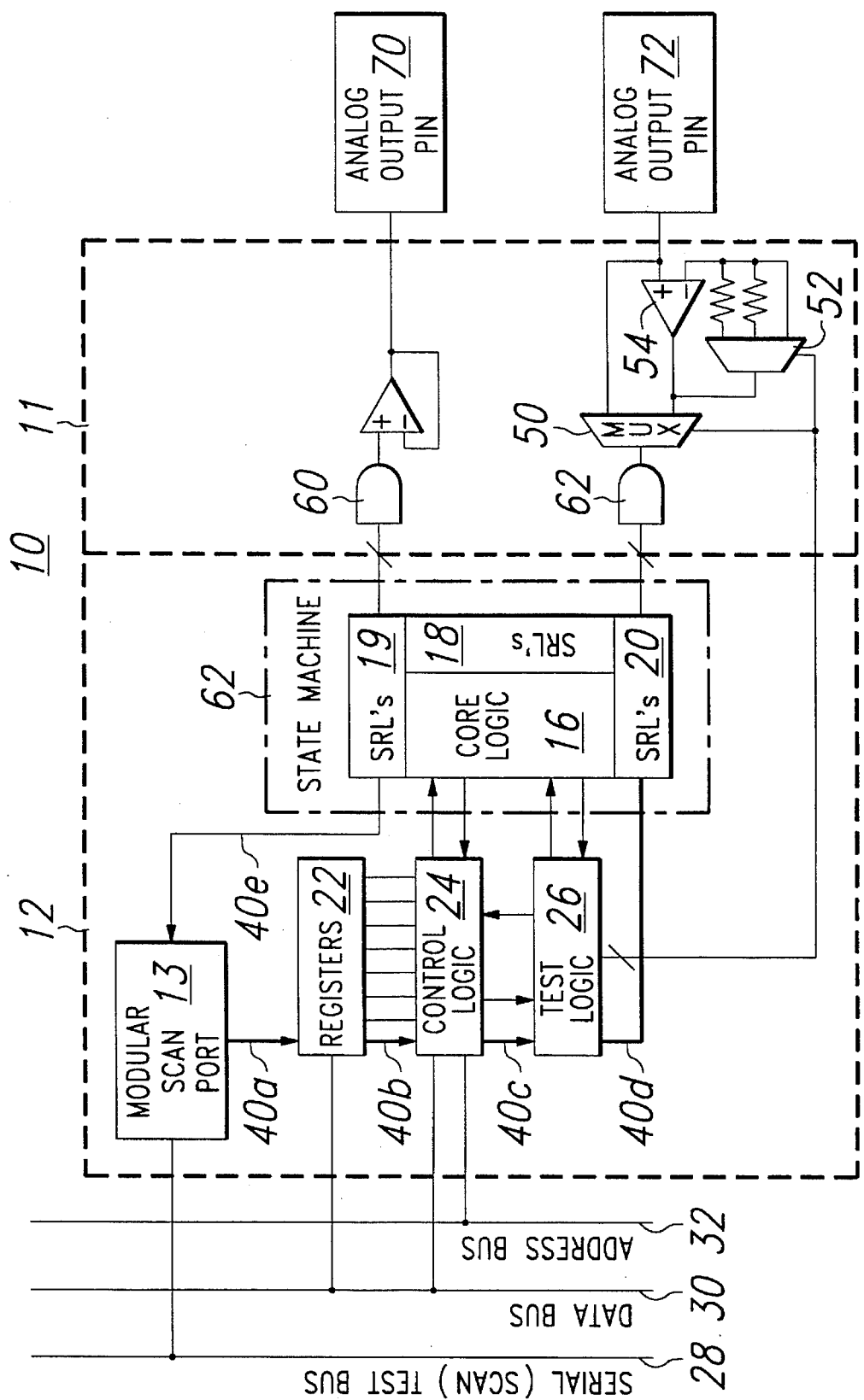
FIG. 1 is a simplified block diagram of a portion of an integrated circuit having analogue circuits therein that are connected in accordance with the teachings of the present invention to allow for testing of such analogue circuits.

Referring now to FIG. 1, there may be seen a portion of an integrated circuit 10 that contains a block of analogue circuitry 11 and a block of digital circuitry 12. As described more fully herein, the methods and circuitry of the present invention place serial digital scan paths, and other circuitry responsive to scan cells (in such paths) and/or appropriate test signals, within the mixed signal or digital circuits and at their input/output interfaces to other mixed signal or digital circuits, so that they may be controlled and observed using standard scan test methodologies. In accordance with the teachings of the present invention, analogue circuitry may be organized into functional blocks and necessary scan or test cells associated with each block to provide for any desired testability of that block. Depending upon the complexity of the analogue circuit block, embedded testing logic may need to be added to the circuit. In addition, according to the teachings of the present invention, scan or test cells may be employed to modify the functions of existing normal logic and/or change the topology of portions of the integrated circuit. Further, a first set of pins of the integrated circuit may be employed to input at least a portion of the desired test signals, and a second set of pins, which may be the same as or different from the first set, employed to sense test output signals. By employing the techniques of the present invention, analogue circuitry may be tested for logic verification, AC parametrics, and/or DC parametrics.

The present invention allows for easy modification of a circuit without requiring modified bond out schemes or unbonded pads. Thus, the methods and circuits of the present invention may be employed for production tests, as well as initial characterization and debugging, both before and after packaging. By employing a scan based methodology, tests for analogue (or mixed signal) circuits may be "canned" for later reuse, even when the analogue portion of the circuitry is embedded within different chips employing differing control/observability interfaces. Further, by making the control points part of a scan chain, internal nodes are not required to be brought out to pins or internal module interfaces, and the resulting circuit is simpler. By employing scan testing methodologies, analogue (or mixed signal) circuit testing may be incorporated with "all-digital" devices with a minimum of effort, when mixed signal circuitry needs to be added to these digital devices.

Continuing to refer to FIG. 1, there may be seen a modular scan port 13 and logic state machine 14 that preferably employs conventional scan test techniques. The state machine 14 includes digital core logic 16 controlled by at least scan register latches (SRLs) 18, 19, 20 during a test. That is, the scan port 13 determines when a test operation is to be performed, via signals on test bus 28 and "enables" the necessary normal and/or test circuitry 22, 24, 26, 30, 32 needed to perform the desired test. As depicted, the normal data bus 30 and address bus 32 may also be employed for testing purposes, although this is not presently preferred. The scan port 13 may control scan register latches (SRLs) 19, 20 associated with analogue circuit 11 to allow for data to be scanned into the SRLs, via scan path 40, to set up needed signals, logic and/or connections for a desired test. Then the appropriate data, signals, or bits are applied to the circuit for the desired test or tests. The scan path 40 is from port 13 to registers 22 (40a) to control logic 24 (40b) to test logic 26 (40c) to SRLs 20 (40d) to SRLs 18 to SRLs 19 and back to port 13 (40e), as depicted in FIG. 1. The test logic 26 may include SRLs that are part of the scan path 40 and signals in these SRLs may be employed to control multiplexers (MUXs) 50,52 to determine which analogue signal is output from the multiplexer 50, 52 in accordance with which device is being tested and the type of testing it is undergoing.

For example, multiplexer 52 may be controlled to select the amount of feedback provided to its associated operational amplifier 54, via selection between open (when the multiplexer is turned "off"), zero, low or high resistances. That is, the gain of the operational amplifier 54 may be selectively changed to a unity gain for certain tests of the amplifier 54, such as for example, but not limited to, a DC offset measurement, in addition to being "open" looped for other desired types of tests. In other circumstances, a different feedback for amplifier 54 could be suitably employed, such as for example, but not limited to, during testing to avoid having to wait for a long "settling" time, e.g. by adjusting the feedback the settling time could be reduced to speed up a test. Thus, the multiplexer 52 under the control of signals scanned into SRLs in test logic 26 may change the topology and/or the function of the analogue circuitry. Conventional analogue testing would require two or more pins to so test amplifier 54.

In a similar manner, multiplexer 50 may be controlled to provide the output of amplifier 54 to A-to-D converter 62 or connect pin 72 to converter 62 so that analogue values may be placed upon pin 72 and the conversion of such values to digital representations by converter 62 evaluated. A-to-D converter 62 is embedded in the analogue circuitry 11 and this technique allows for its testing without having a separate and dedicated test pin. The SRLs 20 represent the digital buffer associated with A-to-D converter 62 and may also be used to capture signals resulting from any of these tests. This arrangement also allows for testing amplifier 54 by placing its output into converter 62 and scanning out, via the scan path 40, the converter's digital values from SRLs 20, as desired analogue values are presented on pin 72. Clearly, converter 62 should be tested first.

In general, in accordance with the teachings of the present invention an observed and/or input signal may be an analogue signal, a digitized version of an analogue signal, or a threshold measurement (i.e. the voltage is above or below a turn on/off threshold).

For D-to-A converter 60, it is also desirable to include a buffer on the "D" side made up of SRLs 19 that is also part of the scan path 40, so that specific digital signals may be placed into the D-to-A 60 to check the linearity of its output, via output pin 70. Any output may be monitored by an ATE examining the signals on analogue output pin 70. That is, the scan path 40 includes SRLs 19 that make up the buffer for D-to-A converter 60. Even if this is done, it may also be desirable to provide added test logic 26 (which may be embedded) to modify some of the existing digital logic 16 to provide the desired test functions, signals, or state machines needed to perform a specific test. For example, SRLs in test logic 26 may be employed to shift the normal logic (in logic block 16) that controls buffer 19 to special test logic that automatically increments and/or decrements the buffer 19 of converter 60 under the control of an appropriate test control signal from test port 13, test bus 28, or a special pin. That is, such SRLs may shift the normal control logic (in logic module 16) for buffer 19 to a basic counter under control of a test control signal. In this manner, the present invention provides a way to controllably alter the function of normal logic and provide controllable test function logic during a test.

Once the scan cells and additional test logic are defined and included in an analogue circuit, the test suites for that circuit may be generated and are transportable with the circuit. That is, a test engineer is not required to write or rewrite the necessary test suites for a circuit depending upon how it is used. In this manner, the techniques of the present invention provide a testable block of circuitry and its associated test suite that may be employed in conventional test schemes. Such test suites may include logic verification, AC parametrics, and/or DC parametrics.

Figure 2:
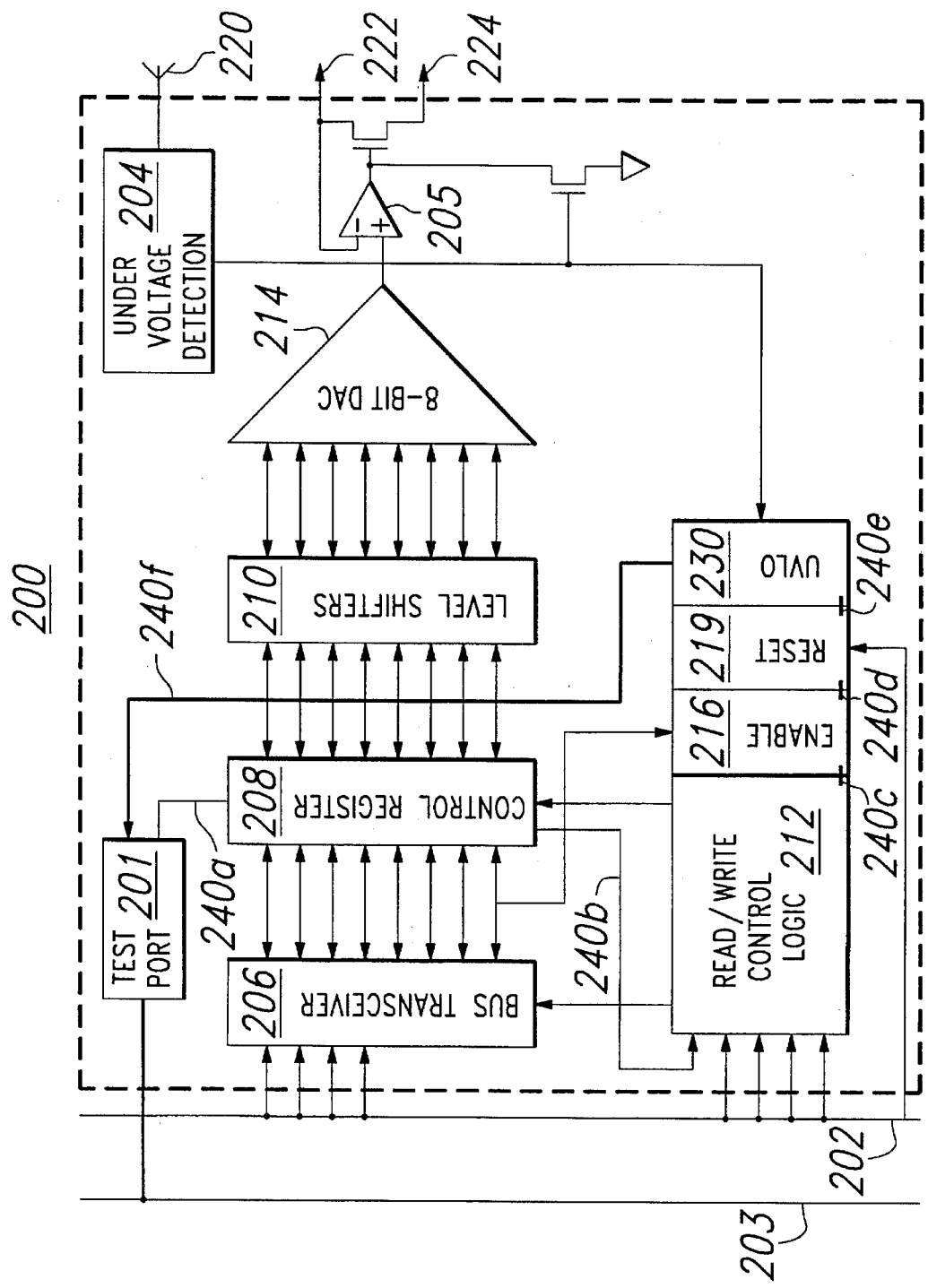
FIG. 2 is a schematic electrical block diagram of a gage driver that may be tested in accordance with the teachings of the present invention.

Referring now to FIG. 2, there may be seen a block diagram of a gage driver 200. Analogue circuit 200 is an example of a simple analogue circuit, that includes some digital circuitry, arranged to include scan cells for testing of its analogue portions in accordance with the teachings of the present invention. This analogue circuit 200 normally receives a digital value from a data, address, and control bus 202 and converts it to an equivalent analogue value. This analogue value in turn drives an analogue gage (not depicted) located off chip that indicates some quantity or value (i.e. the amount of liquid in a tank). This circuit 200 has a low voltage threshold sensor 204 to turn "off" the final output driver 205 to protect the output driver stage when the supply voltage is too low.

As may be seen from FIG. 2, the digital value is normally loaded or written into a bus transceiver 206 from bus 202. Alternatively, digital values may be read from transceiver 206 onto bus 202. For example, a CPU (not depicted) might write a digital value, or read a digital value using its normal control, data and address buses 202. Read/write control logic 212 controls the transceiver 206 and register 208 to either read data from or write data into control register 208. Read/write logic 212 is in turn controlled by control signals on control bus 202. Control register 208 has normal data storage elements that are SRLs and these SRLs are placed in a scan chain 240. The level shifters 210 shift the incoming normal digital voltages to the higher voltage employed by the analogue circuitry of D-to-A 214. The analogue circuitry is supplied with a voltage appropriate for analogue components by power pin 220 and with a ground by ground pin 224.

In a normal mode, the read/write control logic 212 would cause the digital value to be transferred off the data bus 202 into the transceiver 206 and transfer it to the level shifters 210 and digital-to-analogue (D-to-A) converter (DAC) 214 which automatically converts it to an analogue value. This analogue value is then passed to an output amplifier buffer stage 205 whose output is on pin 222. The final output 222 may be turned on or off by controlling enable logic 216, reset logic 219, or under voltage lockout logic 230 (which via under voltage detector 204 monitors the level of the supply voltage 220). Reset logic 219 initializes the output driver 205 and the registers 208. Enable logic 216 allows for user (or CPU control over the output driver 205; typically, the enable logic 216 is used to turn on the output stage 205 to provide an analogue output on pin 222. These various blocks of logic are digitally tested for proper operation by including SRLs in their logic circuits. These SRLs may also be employed to test the analogue portions of the circuit.

That is, in a test mode the only data presented to the D-to-A 214 is that data scanned into the SRLs 208. Alternatively, the normal data bus 202 could be used in the test mode to supply such test digital values, but this is not presently preferred. The test data is scanned into SRLs 208 via a scan chain 240 that runs from the test port 201 to the register SRLs 208 (240a) to the control logic 212 (240b) to the enable block 216 (240c) to reset block 219 (240d) to UVLO block 230 (240e) and back to port 201 (240f).

Test port 201 is also connected to test bus 203. Test bus 203 provides the requisite signals to port 201 to cause a test and select the appropriate module, as well as provide the scan in and scan out paths. Control logic 212 includes SRLs in the scan chain 240 that isolate the logic from the normal bus 202, so that any desired signal may be provided to this logic 212 for testing purposes. D-to-A converter 214 may be tested by presenting a desired range of digital values to it and measuring the analogue output of amplifier 205 via normal output pin 222. Pin 222 (and optionally pin 224) may be defined to be a second "set" of all of the pins of the integrated circuit 200 for sensing test result output signals. In this manner, the low, the high and incremental step values of amplifier 205 in conjunction with DAC 214 may be determined to evaluate their acceptability. Thus, the present invention provides a simple way to use SRLs at the input and output nodes of a functional block of analogue circuitry to test that analogue circuitry.

In a similar manner, the threshold voltage value of the under voltage detector 204 may be tested by providing a sequence of analogue voltage values on pin 220. Pin 220 may be defined to be a first "set" of all of the pins of the integrated circuit 200 for providing or inputting test signals or suites (or portions of test suites). Once the threshold is reached the UVLO 230 SRL is reset to a different value. By continuously scanning through the scan chain 240 it is possible to identify when this change occurs and thereby identify what analogue value "triggered" detector 204. Then the direction (increasing or decreasing) of the analogue values may be reversed while again scanning the chain 240 continuously to determine when the detector 204 resets. In this manner, timing, hysterysis, and threshold or reset values for analogue circuitry may be tested and determined if satisfactory.

Figure 3:
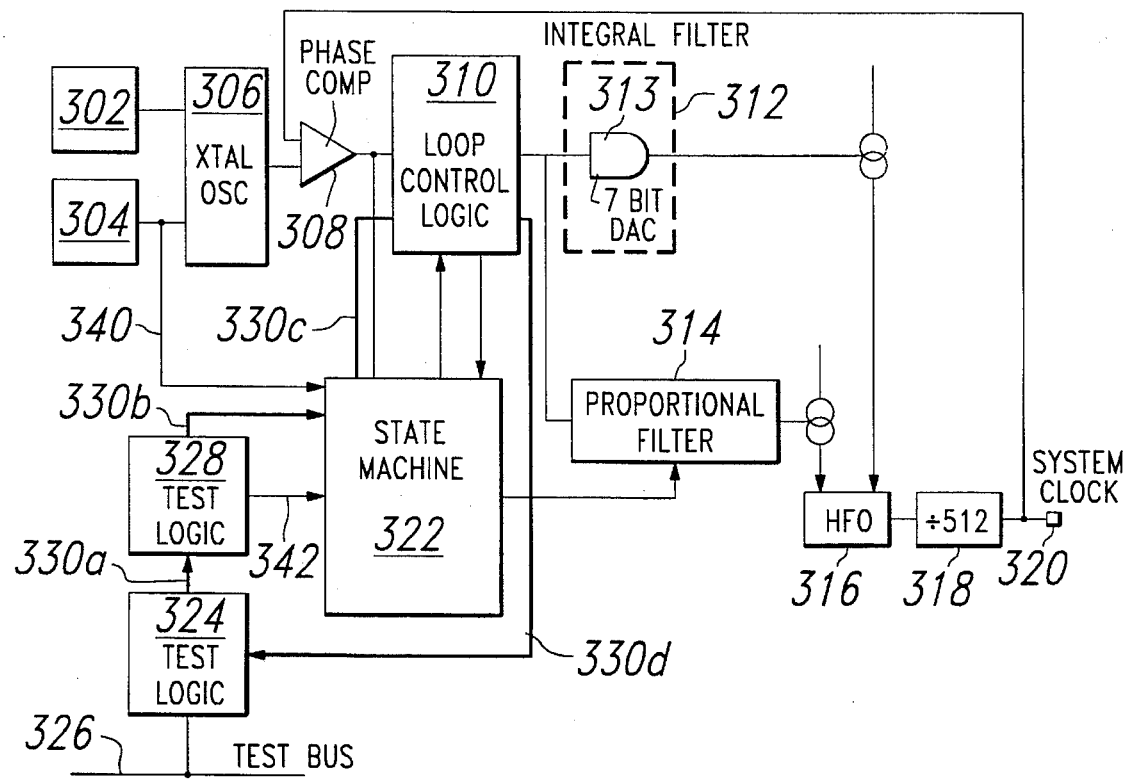
FIG. 3 is a schematic electrical block diagram of a Phase Lock Loop (PLL) circuit configured to be tested in accordance with the teachings of the present invention.

Referring now to FIG. 3, there may be seen a PLL circuit module 300 configured to be testable in accordance with the teachings of the present invention. Analogue circuit 300 is another example of an analogue circuit, that includes some digital circuitry, arranged to include scan cells for testing of its analogue portions in accordance with the teachings of the present invention. More particularly, there may be seen a conventional PLL circuit that normally employs an external crystal connected to pins 302, 304 to drive oscillator 306 which is connected to a phase comparator 308. Comparator 308 is normally connected to loop control logic 310 which is connected to filter 312, that includes a D-to-A converter 313, and filter 314. These two filters are connected to high frequency oscillator (HFO) 316 whose output is divided by a 512 divider 318 to provide a normal clock output, which is provided as an output on pin 320 and as feedback to phase comparator 308. In addition, a state machine 322 may exercise some control over the response or control of the loop control logic 310 to signals from the phase comparator 308.

A test port 324 is connected to a test bus 326 and to test logic 328. A scan in path 330 runs from the port 324 to the test logic 328 (330a) to the state machine 322 (330b) to the control logic 310 (330c) to the test port 324 (330d). One SRL in the scan chain in the test logic 328 may preferably be employed to provide a signal (via line 342) to enable or disable a second parallel sequence or function for the state machine 322. Again, the present invention may employ scan cells to change the function of logic in the circuitry. When this second function is enabled, the state machine 322 ignores any signals from the phase comparator 308, effectively breaking the feedback loop for test control purposes. Similarly, pass gates, controlled by test control signals or an SRL, may be placed in feedback loops for other types of analogue circuitry to allow for test control.

When in this second function, state machine 322 is in essence a counter that increments and/or decrements control logic 310 to in turn increment and/or decrement the DAC block 313; this incrementing may be controlled by appropriate signals (such as positive pulses) on pin 304, via line 340. In normal operation, state machine 322 ignores any signals from line 340. Note that, in accordance with the teachings of the present invention, pin 304 has switched from its normal analogue use to a digital use during a test operation. Again, the present invention may employ scan cells to change and/or modify a normal logic function and/or the topology of the circuitry. This allows for testing of the PLL over any desired range and also allows for linearity and settling measurements of the DAC 313, via normal output pin 320. The frequency range of the HFO 314 may be determined, as well as the size of any frequency step of the DAC 313 and HFO 314 combination. In this manner the oscillator stability and jitter may be determined.

In addition, the buffer (not depicted) for the DAC 313 may be composed of SRLs that are a part of the scan path 330, if desired, so that it may be directly loaded with a digital value. By including the buffer in the scan path 330, maximum test flexibility is maintained without impacting the total pin count for the IC.

As noted earlier herein, state machine 322 includes SRLs that are part of the scan path 330. These SRLs are used initially for conventional "stuck fault" or "stuck at" testing before proceeding with the analogue testing. In a similar manner, control logic 310 includes SRLs that are part of the scan path 330 and are used for "stuck fault" testing, but may also be employed for testing analogue circuitry as noted earlier herein.

Figure 4:
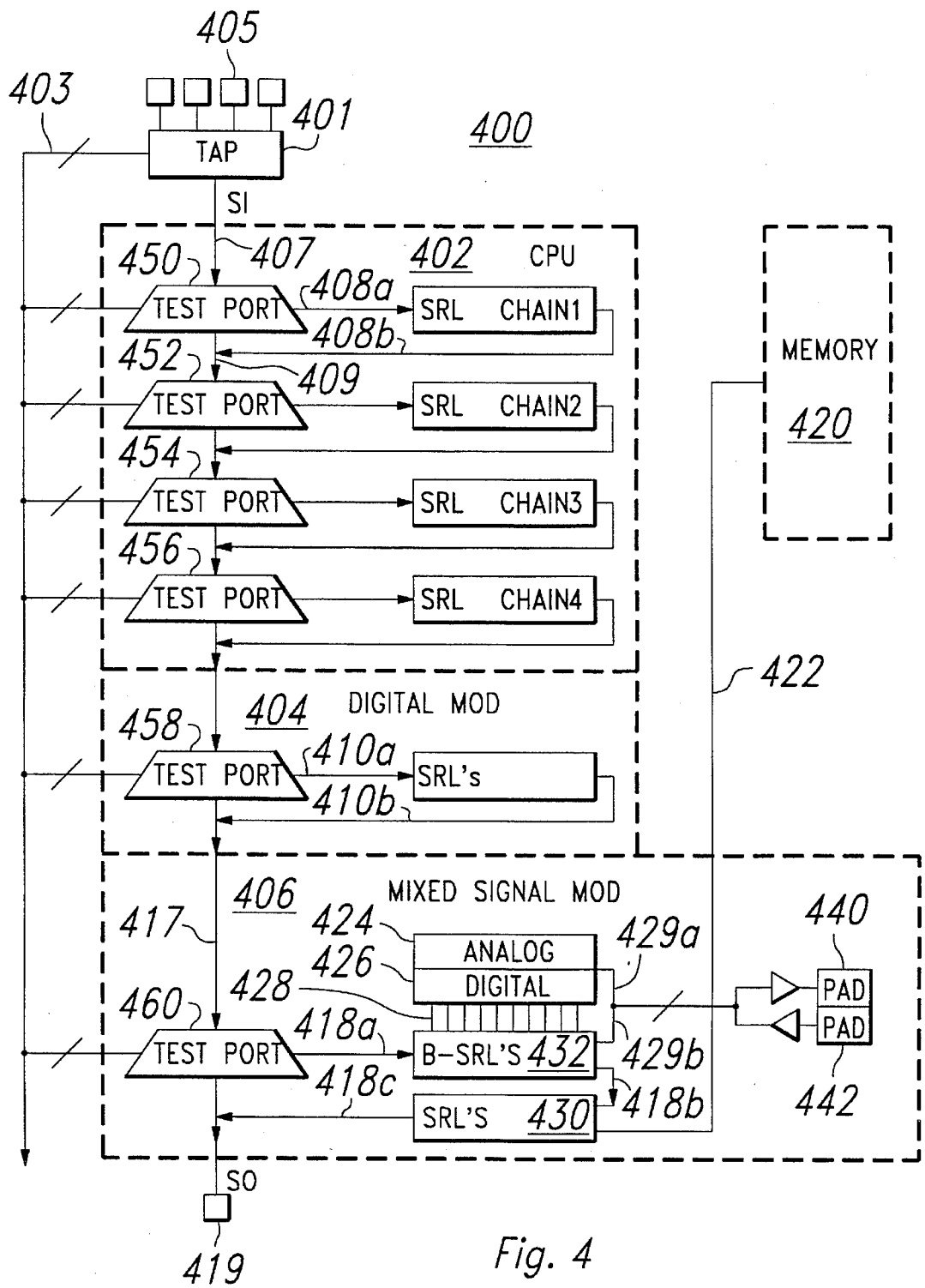
FIG. 4 is a simplified block diagram of an IC containing both analogue and digital modules connected to a common test bus, which may be used for digital "stuck-at" testing, and in accordance with the teaching of the present invention, for scan based testing of analogue and/or digital circuitry.

Referring now to FIG. 4, there may be seen a block diagram 400 for testing an IC containing analogue and digital functional modules. More particularly, it may be seen that there is a CPU module 402, a digital module 404, a mixed signal module 406, and a memory module 420. A test access port (TAP) 401 having, for example, four external pins 405 is connected to a test bus 403 that contains signals from port 401 that may be used to select one or more of the plurality test ports 450–460 (and associated module(s) to be tested) connected to test bus 403, and enable any normal and/or test circuitry needed to test that module, or modules. Each module may be separately tested, or tested together. Test bus 403 is connected to the test ports 450–460 of both digital and mixed signal modules. That is, in accordance with the teachings of the present invention, test access port 401 and test bus 403 may be employed to test both types of circuitry, using conventional scan cells and conventional scanning techniques. Optionally, test pins may be employed in lieu of port 401, bus 403, and ports 450–460.

Test access port 401 also provides a scan path 407, 409, 417, via a scan in (SI) pin 405 and a scan out (SO) pin 409, for the various SRL chains 408, 410, 418 that are each associated with a test port. Each test port may be set by test access port 401 with a signal or bit that indicates whether that test port and associated chain of SRLs are to be scanned in, in a "data scan in" mode. Each test port may also be set with a bit by test access port 401 that indicates whether that test port and associated chain of SRLs are to be included in a preselected test mode. In this manner, data necessary for a specific test of a module may be scanned into the SRL chain associated with that module, whether digital and/or analogue, and the test port for the SRL chain selected to conduct that test.

The testing of CPU module 402 and digital module 404 uses known test scan techniques. The testing of mixed signal module 406 is in accordance with the teachings of the present invention, as described earlier herein. As depicted in FIG. 4, the mixed signal module 406 may be divided into a digital portion 426 and an analogue 424 portion. The digital portion 426 interfaces with and transfers signals to and from the SRLs, via lines 428. B-SRLs 432 are boundary SRLs that employ conventional master/slave cycles but eliminate the normal one cycle delay associated with SRLs in their normal operation. Pins or pads 440, 442 may be employed to input and/or output signals from either the analogue 424, via line(s) 429a, and/or digital 426, via line(s) 429a, portion of the mixed signal module 406, as well as to/from B-SRLs 432, via line(s) 429b.

Portions of the memory 420 may be preloaded with logic or test vectors that may be transferred into the SRL's 430, 432 (to load data into the SRL's), via normal bus 422. In a similar manner, data may be transferred out of the SRL's 430, 432 into memory 420 and later downloaded and/or analyzed.

The SRL's 430, 432 serve as scannable controllability and/or observability points for the analogue circuit 424. In addition, the normal pins 440, 442 associated with this module 406 may also serve as controllability and/or observability points, and may be a "set" of the IC's pins.

Figure 5:
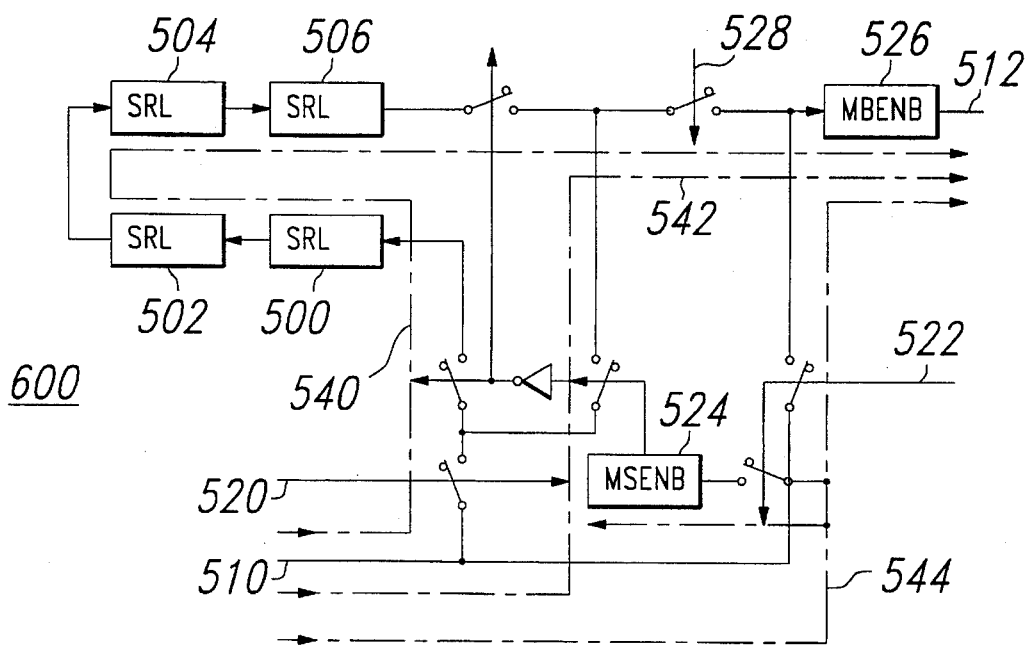
FIG. 5 is a simplified block diagram of a test port suitable for use with the techniques of the present invention.

Referring now to FIG. 5 there may be seen a block diagram of a test port 600 that may be employed as the test port referred to in FIG. 1 (item 13), FIG. 2 (item 201), FIG. 3 (item 324), and FIG. 4 (items 450–460). More particularly, it may be seen that a representative chain of SRLs 500, 502, 504, 506 may be scanned or not scanned via a scan in line 510 and scanned out via a scan out line 512, depending upon control signals 520, 522, 524, 526, 528 from a test bus (not depicted). The scan in line 510 of one port 600 may be connected to the scan out line 512 of the previous port to provide a chain of ports as depicted in FIG. 4. The scan in line 510 of the initial port in the chain is normally connected to either a test bus scan in line or a scan in pin, and the scan out line 512 of the last port in the chain is connected to either a test bus scan out line or a scan out pin. The operation and construction of test port 600 is similar to the test ports disclosed in U.S. Pat. No. 4,860,290.

The test port 600 has a control scan path mode depicted by dotted line 544. The test port 600 also has a data scan path mode with the chain selected, depicted by dashed and double dotted line 540, and a data scan path mode with the chain not selected, depicted by dashed and single dotted line 542. Pin 520 and pin 528 are provided with the appropriate signals to energize and shut their respective "switches" by the selection of a data scan mode. If the chain has been selected, then MSENB 524 will be in a "zero" state and its first switch will be open while its two associated "inverted" switches will be closed; if the chain has not been selected, then MSENB 524 will be in a "one" state and its first switch will be closed while its two associated "inverted" switches will be open. MBENB 526 is a control signal that is always in the scan path and is used to ensure isolation of modules not under test to prevent any modules that are not selected from corrupting the testing of the module being tested. If the module associated with a chain has been selected then MBENB 526 for that chain will typically be in a "one" state. However, neither "state" of MBENB 526 will inhibit data flow therethrough. Pin 522 is provided with an appropriate signal to shut its associated switches when a control scan mode is selected. MSENB 524 and MBENB 526 are part of the control scan path 544 and their state is set during the scan in of the control scan path 544.

Many other variations and modifications may be made in the techniques and apparatus hereinabove described, by those having expertise in this technology, without departing from the concepts of the present invention. Accordingly, it should be clearly understood that the methods and apparatus depicted in the accompanying drawings and referred to in the foregoing description are illustrative only and are not intended as limitations on the scope of the invention.

What is claimed is:

1. A method for designing analog circuitry for testability, comprising:

organizing said analog circuitry into a functional block;

adding other circuitry to change the topology of said circuitry in response to at least one test signal;

adding scan cells to provide said test signal;

creating test vectors that are shifted into said scan cells to produce said test signal, wherein said test vectors comprise analog test signals which are shifted into said scan cells concurrently with digital data; and re-using said functional block and test vectors on a plurality of integrated circuit types.

2. The method of claim 1, further comprising:

including a digital to analog converter in said functional block; and adding scan cells to provide a test data value as an input to said digital to analog converter.

3. The method of claim 1, further comprising:

including an analogue to digital converter in said functional block; and providing scan cells to capture a digital test result which is responsive to an operational parameter of said functional block.

* * * * *